(12) United States Patent
Parris et al.

(10) Patent No.: US 6,317,007 B1
(45) Date of Patent: Nov. 13, 2001

(54) DELAYED START OSCILLATOR CIRCUIT

(75) Inventors: Michael C. Parris; Douglas B. Butler, both of Colorado Springs, CO (US)

(73) Assignees: United Memeories, Inc., Colorado Springs, CO (US); Sony Corporation Core Technology & Network Company, Tokyo (JP)

( * ) Notice: Subject to any disclaimer, the term of this patent is extended or adjusted under 35 U.S.C. 154(b) by 0 days.

(21) Appl. No.: 09/520,599

(22) Filed: Mar. 8, 2000

(51) Int. Cl.$^7$ ........................................ H03B 5/00
(52) U.S. Cl. ........................ 331/57; 365/222; 327/534; 327/548
(58) Field of Search ..................... 331/57, 36 C, 331/185, 186; 365/222; 327/172, 175, 534, 548

(56) References Cited

U.S. PATENT DOCUMENTS 6,163,225 * 12/2000 Sundaram et al. ..................... 331/57

\* cited by examiner

*Primary Examiner*—Arnold Kinkead
(74) *Attorney, Agent, or Firm*—William J. Kubida; Stuart T. Langley; Hogan & Hartson LLP

(57) ABSTRACT

A delayed start oscillator includes an oscillator enable signal having first and second states thereof for selectively enabling and disabling the oscillator respectively. An oscillator output signal has first and second levels thereof responsive to the first state of the oscillator enable signal for providing an oscillator output signal. A timing circuit is coupled to a supply voltage line for providing a timing signal output indicative of a selected delayed start duration and a plurality of series connected inverting stages are coupled to receive the oscillator output signal and the timing signal. The oscillator output signal remains at a first level for the delayed start duration in response to the timing signal and subsequently transitions between the first and second levels at an operational frequency determined by the plurality of inverting stages until the oscillator enable signal transitions to the second state thereof. The delayed start oscillator is operational to provide an output clock signal at a constant rate following a selectively delayed startup time and can be used, for example, in dynamic memory cell-based integrated circuit devices incorporating a-self-refresh mode or other special modes of operation wherein an initial start-up delay in entering the particular mode is desired and in which the initial delay is longer than the clock period of the signal then controlling the mode.

10 Claims, 2 Drawing Sheets

US 6,317,007 B1

DELAYED START OSCILLATOR CIRCUIT

BACKGROUND OF THE INVENTION

The present invention relates, in general, to the field of integrated circuit ("IC") devices. More particularly, the present invention relates to a delayed start oscillator of especial utility with respect to dynamic random access memory ("DRAM") devices or other integrated circuit devices having a self-refresh or other modes of operation requiring an initial start-up delay in entering the particular mode.

Current IC memory devices may utilize an on-chip oscillator to generate a signal with a desired frequency to enable memory access operations. Among those which may be utilized are complementary metal oxide semiconductor ("CMOS") ring oscillators. These oscillators utilize an odd number of inverting stages, each comprising a P-channel and N-channel transistor, to provide the correct polarity of feedback for the circuit. In general, the frequency of oscillation for a ring oscillator is determined by the collective inverter propagation delays. Presently, all such oscillators cycle at a constant rate and without the ability to provide a selectively delayed start-up time.

SUMMARY OF THE INVENTION

The delayed start oscillator of the present invention is operational to provide an output clock signal at a constant rate following a selectively delayed startup time and can be used, for example, in dynamic memory cell-based integrated circuit devices incorporating a self-refresh mode or other special modes of operation wherein an initial start-up delay in entering the particular mode is desired and in which the initial delay is longer than the clock period of the signal then controlling the mode.

Particularly disclosed herein is a delayed start oscillator comprising an oscillator enable signal having first and second states thereof for selectively enabling and disabling the oscillator respectively; an oscillator output signal having first and second levels thereof responsive to the first state of the oscillator enable signal for providing an oscillator output signal; a timing circuit coupled to a supply voltage line for providing a timing signal output indicative of a selected delayed start duration; and a plurality of series connected inverting stages coupled to receive the oscillator output signal and the timing signal. The oscillator output signal remains at a first level thereof for the delayed start duration in response to the timing signal and subsequently transitions between the first and second levels at an operational frequency determined by the plurality of inverting stages until the oscillator enable signal transitions to the second state thereof.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
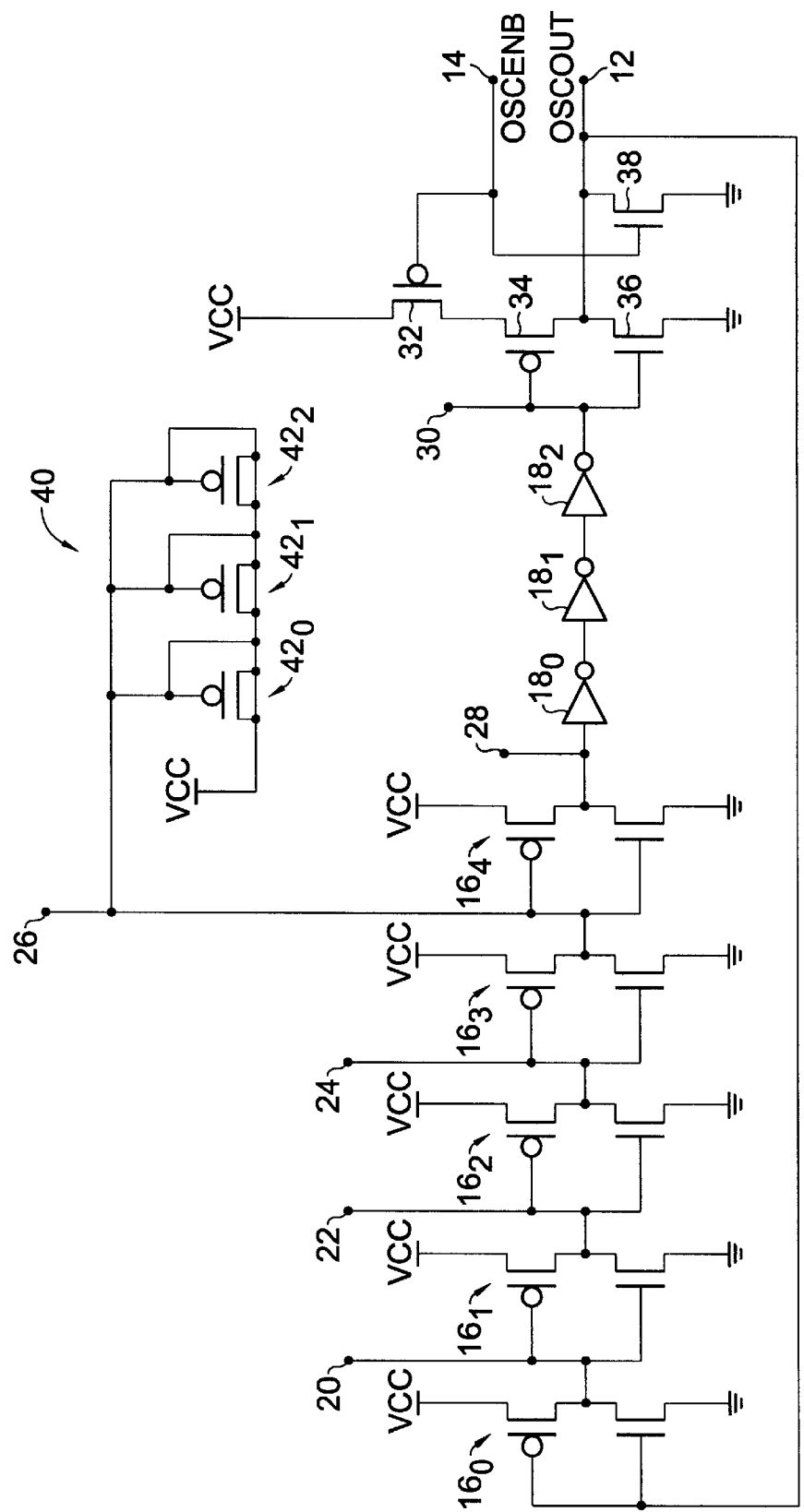
FIG. 1 is a schematic diagram of a particular implementation of a delayed start oscillator in accordance with the present invention for possible use in a DRAM memory device for implementing a self-refresh mode of operation.

With reference now to FIG. 1, a schematic diagram of a particular implementation of a delayed start oscillator 10 in accordance with the present invention is shown for possible use in a DRAM memory device for implementing a self-refresh mode of operation. The delayed start oscillator 10 advantageously provides a delayed start oscillator output ("OSCOUT") signal on line 12 in response to an oscillator enable bar ("OSCENB") input signal on line 14 as will be more fully described hereinafter.

The oscillator output signal on line 12 is fed back to the common connected gate terminal input of a first inverter $16_0$ comprising series connected P-channel and N-channel MOS transistors coupled between a supply voltage source (VCC) and circuit ground. The output of the first inverter $16_0$ is taken at node 20 intermediate the P-channel and N-channel transistors. Node 20 is, in turn, coupled to the input of a similar inverter $16_1$, which has its output at node 22 coupled to the input of inverter $16_2$ which has its output at node 24 coupled to the input of inverter $16_3$. The output of inverter $16_3$ is defined as timer node 26 and it is coupled to the input of inverter $16_4$ which has its output defined as node 28. Node 28 is coupled through three invertors $18_0$, $18_1$, and $18_2$ to node 30.

Node 30 is then coupled to the gate terminals of P-channel transistor 34 and N-channel transistor 36 which are connected in series with P-channel transistor 32 between VCC and circuit ground as shown. An additional N-channel transistor 38 is coupled in parallel with N-channel transistor 36 and has its gate terminal coupled to the gate terminal of P-channel transistor 32 and line 14 to receive the OSCENB signal. The output of the delayed start oscillator 10 is provided at line 12 which is coupled intermediate P-channel transistor 34 and N-channel transistor 36. Also as shown, a relatively large value capacitor 40 is coupled between VCC and node 26 as shown, the capacitor 40 comprises parallel connected MOS capacitors $42_0$, $42_1$, and $42_2$. In operation, the clock period of the delayed start oscillator 10 is controlled primarily by the discharging of the relatively large capacitor 40 through the N-channel and P-channel transistors of inverter $16_3$.

Figure 2:
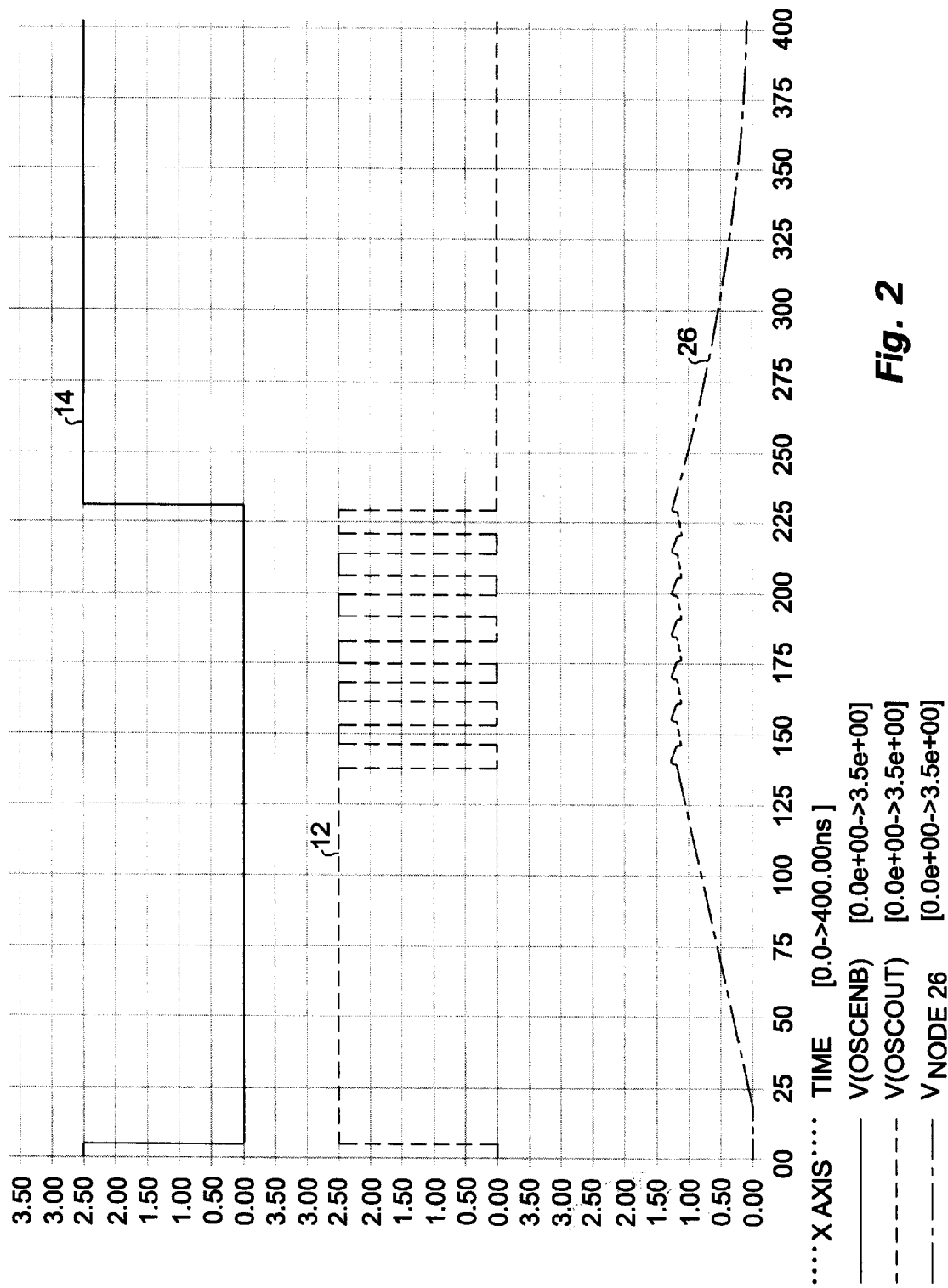
FIG. 2 is a graphical illustration of the operation of the delayed start oscillator of the preceding figure showing the relationship among the oscillator enable, oscillator output and the timer node thereof.

With reference additionally now to FIG. 2, a graphical illustration of the operation of the delayed start oscillator 10 of the preceding figure is shown indicating the relationship among the OSCENB signal on line 14, the OSCOUT signal on line 12 and the corresponding signal at the timer node 26 thereof. In order to start, or enable, the delayed start oscillator 10, signal OSCENB on line 14 is brought to an active logic "low" state shortly after time "00". As indicated, the timer node 26 is initially at 0 volts since the OSCENB signal forces node 12 "low", nodes 20 and 24 "high". After the OSCENB signal is brought "low", node 24 then also goes "low" charging node 26 up. After node 26 approaches VCC/2, (approximately 1.5 volts in a 3.0 volt implementation) the next stage of the delayed start oscillator 10, inverter $16_4$, switches. All of the other inverter stages 16 then switch after wrapping back around. Node 24 will then transition to a logic "high" and node 26 will go "low" before it moves much from the VCC/2 level. If the timing circuit, comprising timing capacitor 40 and the timing resistance of the P-channel and N-channel transistors of inverter $16_3$, are made large with respect to the other stages of the delayed start oscillator 10, this initial delay can be made relatively long compared to the oscillation of the output. For example, a particular width-to-length ratio is utilized for these devices as will be described in more detail hereinafter.

As indicated, the output signal OSCOUT on line 12 provides a selected delay following the falling edge of the OSCENB signal on line 14. It remains in this state until the timing node 26 is charged to substantially VCC/2 at which time, the OSCOUT signal then provides the desired frequency output. The OSCOUT oscillation continues for so long as the OSCENB signal is "low", whereupon it ceases operation until such time as the OSCENB signal is again brought "low" initiating the selected delay and oscillator frequency output.

In the particular implementation shown in FIG. 1 and modeled in FIG. 2, the following element specifications may be utilized. The N-channel transistors of inverters $16_1$, $16_2$, $16_3$ and $16_4$ may have a channel width of substantially 2.0 microns while the remaining N-channel devices may have a channel width of approximately 4.0 microns. The N-channel transistor of inverter $16_3$ may have a width to length ratio of about 0.2. The P-channel transistors of inverters $16_0$, $16_1$, $16_2$ and $16_4$ may have a channel width of about 4.0 microns while P-channel transistors 32, 34 have a width of 12.0 microns and the P-channel transistor of inverter $16_3$ has a width of 2.0 microns and a length of 9.0 microns. In the particular implementation shown, the MOS capacitor $42_0$ has a width of 38 microns and a length of 10 microns; the MOS capacitor $42_1$, has a width of 19 microns and a length of 10 microns and the MOS capacitor $42_2$ has a width of 9.0 microns and a length of 10 microns. The inverting amplifiers $18_0$–$18_2$ inclusive may have a P-channel width of 4.0 microns and an N-channel width of 2.0 microns each.

While there have been described above the principles of the present invention in conjunction with specific oscillator elements and component sizes, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A delayed start oscillator comprising:

an oscillator enable signal having first and second states thereof for selectively enabling and disabling said oscillator respectively;

an oscillator output signal having first and second levels thereof responsive to said first state of said oscillator enable signal for providing an output signal;

a timing circuit coupled to a supply voltage line for providing a timing signal output indicative of a selected delayed start duration; and a plurality of series connected inverting stages coupled to receive said oscillator output signal and said timing signal, said oscillator output signal remaining at a first level thereof for said delayed start duration in response to said timing signal and subsequently transitioning between said first and second levels at an operational frequency determined by said plurality of inverting stages until said oscillator enable signal transitions to said second state thereof, wherein said timing circuit comprises a capacitance selectively couplable between said supply voltage line and a reference voltage line through one of said plurality of inverting stages for charging said capacitance.

2. The delayed start oscillator of claim 1 wherein said plurality of inverting stages comprises an odd number of stages.

3. The delayed start oscillator of claim 2 wherein said plurality of inverting stages comprises nine inverting stages.

4. The delayed start oscillator of claim 1 wherein each of said plurality of inverting stages comprises a CMOS inverter.

5. The delayed start oscillator of claim 1 wherein said capacitance comprises at least one MOS capacitor.

6. The delayed start oscillator of claim 5 wherein said at least one MOS capacitor comprises a plurality of parallel coupled MOS capacitors.

7. The delayed start oscillator of claim 1 wherein said selected delayed start duration is proportional to a time required to charge said capacitance to a reference voltage level substantially one half a voltage on said supply voltage line.

8. The delayed start oscillator of claim 7 wherein said capacitance remains substantially at said reference voltage level while said oscillator output signal transitions between said first and second levels at said operational frequency.

9. The delayed start oscillator of claim 7 wherein said capacitance discharges toward an initial level thereof when said oscillator enable signal transitions to said second state thereof.

10. The delayed start oscillator of claim 1 wherein said capacitance charges to substantially one half of a voltage on said supply voltage line in a time period that is relatively long with respect to a final oscillating period of said oscillator.

* * * * *

UNITED STATES PATENT AND TRADEMARK OFFICE
CERTIFICATE OF CORRECTION

PATENT NO.   : 6,317,007 B1                                             Page 1 of 1
DATED        : November 13, 2001
INVENTOR(S)  : Michael C. Parris and Douglas B. Buther It is certified that error appears in the above-identified patent and that said Letters Patent is hereby corrected as shown below:

Title page,
Item [73], Assignees, please delete "United Memeories, Inc." and substitute thereof
-- United Memories, Inc. --.

Signed and Sealed this

Sixteenth Day of April, 2002

*Attest:*

JAMES E. ROGAN
*Attesting Officer*          *Director of the United States Patent and Trademark Office*